United States Patent
Muelders et al.

(10) Patent No.: US 11,549,653 B2
(45) Date of Patent: Jan. 10, 2023

(54) LIGHTING DEVICE

(71) Applicant: Lumileds LLC, San Jose, CA (US)

(72) Inventors: Barbara Muelders, Aachen (DE); Floris Maria Hermansz Crompvoets, Bunde (NL); Benno Spinger, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 17/553,140

(22) Filed: Dec. 16, 2021

(65) Prior Publication Data
US 2022/0107065 A1 Apr. 7, 2022

Related U.S. Application Data

(63) Continuation of application No. 17/002,147, filed on Aug. 25, 2020, now abandoned.

(30) Foreign Application Priority Data

Aug. 26, 2019 (EP) ..................... 19193525

(51) Int. Cl.
| | |
|---|---|
| *F21K 9/90* | (2016.01) |
| *F21S 41/153* | (2018.01) |
| *H01L 33/62* | (2010.01) |
| *F21Y 105/16* | (2016.01) |
| *F21Y 115/10* | (2016.01) |

(52) U.S. Cl.
CPC ............. *F21S 41/153* (2018.01); *F21K 9/90* (2013.01); *H01L 33/62* (2013.01); *F21Y 2105/16* (2016.08); *F21Y 2115/10* (2016.08)

(58) Field of Classification Search
CPC . F21Y 2105/16; F21Y 2115/10; F21S 41/663; F21S 41/153; F21S 41/141; H01L 33/38; H01L 33/44; H01L 33/007; H01L 27/156; F21W 2107/10; F21K 9/90
See application file for complete search history.

(56) References Cited

U.S. PATENT DOCUMENTS

| | | | |
|---|---|---|---|
| 10,133,426 B2 * | 11/2018 | Den Boer | ............. G06F 3/0445 |
| 2006/0175621 A1 | 8/2006 | Ohtsuka et al. | |
| 2019/0267357 A1 | 8/2019 | Iguchi et al. | |

FOREIGN PATENT DOCUMENTS

| | | |
|---|---|---|
| EP | 3026705 A1 | 6/2016 |
| FR | 3058570 A1 | 5/2018 |
| WO | 2019050939 A1 | 3/2019 |

* cited by examiner

*Primary Examiner* — Omar Rojas Cadima
(74) *Attorney, Agent, or Firm* — Servilla Whitney LLC

(57) ABSTRACT

A lighting device according to the invention comprises at least one semiconductor layer; at least one light emission surface comprising an array of high luminance areas configured to emit light at a first local luminance level and low luminance areas configured to emit no light or to emit light at a second local luminance level lower than the first local luminance level; a plurality of semiconductor light emitting devices formed in the semiconductor layer to define the plurality of high luminance areas; wherein the high luminance areas and the low luminance areas are arranged in accordance with a predefined light emission profile of the light emission surface.

13 Claims, 3 Drawing Sheets

LIGHTING DEVICE

CROSS REFERENCE TO RELATED APPLICATIONS

This application is a Continuation of U.S. patent application Ser. No. 17/002,147, filed Aug. 25, 2020, which claims the benefit of European Patent Application No. 19193525.3, filed on Aug. 26, 2019, the contents of which are hereby incorporated by reference herein.

FIELD OF THE INVENTION

The present disclosure relates to a lighting device comprising at least one semiconductor layer, and at least one light emission surface, wherein high luminance areas and low luminance areas of the light emission surface are arranged in accordance with a predefined light emission profile.

BACKGROUND OF THE INVENTION

Lighting devices comprising semiconductor light emitting devices such as light-emitting diodes (LEDs) may form advantageous light sources in many fields of applications including hand-held battery powered devices, such as cameras and cell phones, automotive applications including automotive head or taillights, etc. Semiconductor light emitting devices can be arranged in one or two-dimensional arrays, where individual semiconductor light emitting devices act as individual pixels. Examples of such arrangements include micro LED arrays or matrices (two-dimensional arrays) typically including pixels with a width of about 100 µm or less (for example 40 µm). Such pixels may for example be separated by recesses, trenches or gaps with a width of e.g. 20 µm or less (for example 5 µm). An exemplary micro LED array is disclosed in US 2019/0198564 A1.

When used for example for automotive headlight applications, semiconductor light emitting devices are usually combined with optical elements such as collimating lenses to direct light into desired directions and to avoid e.g. upward projection of light, thereby avoiding undesirable glare to oncoming road users. Headlight beam distributions may be shaped by mapping multiple luminance images of the light source onto one another (within a Fourier plane of the optics) using dedicated and specifically tailored optical elements.

However, while such optical elements may be tailored to satisfactory quality, there is still room for improvement.

SUMMARY

It is an object of the present invention to provide a lighting device that allows for an improved light emission enabling improved mapping of light source images for example for automotive headlight applications. The invention further relates to a method of producing a lighting device and to a use of a lighting device.

According to a first aspect of the present invention a lighting device is provided comprising at least one semiconductor layer; at least one light emission surface comprising an array of high luminance areas configured to emit light at a first local luminance level and low luminance areas configured to emit no light and/or to emit light at a second local luminance level lower than the first local luminance level; a plurality of semiconductor light emitting devices formed in the semiconductor layer to define the plurality of high luminance areas; wherein the high luminance areas and the low luminance areas are arranged in accordance with a predefined light emission profile of the light emission surface.

According to a second aspect of the present invention, a method of producing a lighting device is provided, the method comprising: providing at least one semiconductor layer; providing at least one light emission surface with an array of high luminance areas configured to emit light at a first local luminance level and low luminance areas configured to emit no light or to emit light at a second local luminance level lower than the first local luminance level; forming a plurality of semiconductor light emitting devices in the semiconductor layer to define the plurality of high luminance areas; arranging the high luminance areas and the low luminance areas in accordance with a predefined light emission profile of the light emission surface.

According to a third aspect of the present invention, a use of a lighting device according to the first aspect for automotive lighting is provided, in particular for automotive headlight applications.

Exemplary embodiments of the first, second and third aspect of the invention may have one or more of the properties described below.

According to an exemplary embodiment, the at least one semiconductor layer may be a layer, for example an epitaxial layer, formed on a suitable substrate from a suitable material to emit photons when excited. Suitable materials include sapphire, GaN, or silicon. In an exemplary embodiment, the semiconductor layer comprises an n-type region (a region doped with n-type dopants), a p-type region (a region doped with p-type dopants) and an active layer in between the n-type and the p-type region.

In an exemplary embodiment, a semiconductor light emitting device (e.g. each of the plurality of semiconductor light emitting devices) is formed in the semiconductor layer for example by suitably electrically contacting the n-type region e.g. with an n-contact formed in a corresponding trench that separates the high luminance area defined by the semiconductor light emitting device from a neighboring high luminance area (neighboring semiconductor light emitting device) or neighboring low luminance area (e.g. a non-electrically-contacted semiconductor light emitting device or one of multiple semiconductor light emitting devices connected in parallel to a power source) and by suitably electrically contacting the p-type region with a suitable p-contact.

According to the first aspect, the light emission surface comprises an array of high luminance areas (e.g. active pixels) and low luminance areas (e.g. low luminance pixels or inactive pixels). In an exemplary embodiment, the high luminance areas respectively correspond to light emitting surfaces of corresponding semiconductor light emitting devices. Further, in the exemplary embodiment, the low luminance areas may respectively correspond to surfaces of corresponding semiconductor light emitting devices that are not electrically connected (not connectable) to a power source and/or that are connected in parallel to a power source. In the latter case, by electrically connecting the respective semiconductor light emitting devices in parallel, while connecting the semiconductor light emitting devices of the high luminance areas in series, a luminance of the low luminance areas may be adjusted to be considerably lower (e.g. equal to or close to zero) as compared to the high luminance areas. In other words, the first local luminance level of the high luminance areas is in an exemplary embodiment considerably higher than the second local luminance level of the low luminance areas. In a preferred embodiment, the first local luminance level of the high luminance areas is higher than the second local luminance level of the low luminance areas at least by a factor of 3 to 10, e.g. by a factor selected from the group of factors 3, 4, 5, 6, 7, 8, 9, 10. Given the difference in luminance, by arranging the high luminance areas and the low luminance areas in accordance with a predefined light emission profile, it becomes possible to advantageously tailor a light emission profile for example of a light source used in an automotive headlight. Thus, a lighting device according to the first aspect of the present invention advantageously allows to tailor a light emission pattern by arranging high and low luminance areas and thus allows to optimize emission characteristics of a corresponding light source in accordance with a given application. For example, it becomes possible to tailor the emission characteristics to be optimized for automotive headlight applications where for example an upward projection of light is to be avoided in order to prevent undesirable glare to oncoming road users. While thus, use of a light source with improved emission profile according to the first aspect may even further improve quality and efficiency using existing optical elements, at the same time, a quality requirement regarding the used optical elements may be moderated such that suitable results may be achieved even with optical elements of lower quality and cost.

In an exemplary embodiment, the array of high luminance areas and low luminance areas comprises low luminance areas configured to emit no light and low luminance areas configured to emit light at a second local luminance level lower than the first local luminance level. For example, by providing low luminance areas configured to emit light at a second local luminance level at a transition between high luminance areas and low luminance areas configured to emit no light, a smooth luminance transition can be generated which in some applications may support a an advantageous image in a corresponding Fourier plane.

In an exemplary embodiment, the lighting device according to the first aspect further comprises a plurality of trenches (or recesses or gaps) formed in the at least one semiconductor layer defining or separating the high luminance areas and the low luminance areas. Such trenches may for example be formed by suitable etching techniques and may be formed partially into or completely through the semiconductor layer. Such trenches are advantageous in that they allow to provide a clear separation between individual high luminance areas (active pixels) and individual low luminance areas (low luminance or inactive pixels).

In an exemplary embodiment, a low luminance area of the low luminance areas (e.g. each of the low luminance areas) corresponds to a portion of the semiconductor layer comprising an n-doped region and a p-doped region, wherein at least one of the n-doped region and the p-doped region is configured not to be electrically connected to a power source. In other words, the n-doped region and/or the p-doped region is not connectable to a power source such that the corresponding low luminance area corresponds to a permanently inactive pixel configured to not emit light. Likewise, in an exemplary embodiment, a high luminance area (e.g. each of the high luminance areas) corresponds to a portion of the semiconductor layer comprising an n-doped region and a p-doped region, wherein both the n-doped region and the p-doped region are electrically connectable to a power source. In other words, the high luminance areas (active pixels) can be turned on and off by connecting the same to the power source, while in this embodiment, the low luminance areas (inactive pixels) cannot be turned on.

In an exemplary embodiment, a low luminance area of the low luminance areas (e.g. each of the low luminance areas) is configured to be electrically connected (e.g. is electrically connected) in parallel with a further low luminance area of the low luminance areas to a power source, and wherein the high luminance areas are configured to be electrically connected (e.g. are electrically connected) in series to the power source. While in this embodiment, it may be possible to electrically connect the low luminance areas to a power source, by connecting the parallel connection of the low luminance areas allows to keep a local luminance level (the second local luminance level) emitted from these pixels considerably lower than the first local luminance level of the high luminance areas. As mentioned, in an exemplary embodiment, the second local luminance level is lower than the first local luminance level at least by a factor of 3 to 10.

In an exemplary embodiment, the lighting device further comprises first contact elements (in particular an array of first contact elements) respectively arranged in correspondence (in particular in a one-to-one correspondence) with the low luminance areas (in particular in direct or indirect mechanical contact therewith) and second contact elements (in particular an array of second contact elements) respectively arranged in correspondence (in particular in a one-to-one correspondence) with the high luminance areas (in particular in direct or indirect mechanical contact therewith). In other words, even in embodiments in which the low luminance areas are not connectable to a power source, in particular the second contact elements are provided e.g. in direct or indirect mechanical contact with the low luminance areas. For example, the first and second contact elements may correspond to respective segments of a segmented conductivity layer arranged in mechanical contact with the lighting device. It was found that providing the first and second contact elements irrespective of whether or not the low luminance areas are connectable with a power source, the provision of the first and second contact elements advantageously supports structural integrity of the lighting device.

In an exemplary embodiment, the first contact elements and the second contact elements are arranged as an array in correspondence with the array of high luminance areas and low luminance areas. In particular in this form, the first and second contact elements help to advantageously support structural integrity of the lighting device.

In an exemplary embodiment, the first contact elements are configured not to be electrically connected with at least one of the n-doped region and the p-doped region of respective low luminance areas. In this embodiment, the low luminance areas are not configured to emit light thus providing a most noticeable difference in luminance level as compared to the luminance level of the high luminance areas.

In an exemplary embodiment, segments of an insulating layer are respectively interspaced in between the first contact elements and corresponding low luminance areas. For example, the insulating layer may comprise a dielectric material, e.g. $SiO_2$, configured to inhibit an electrical connection between the first contact elements and the corresponding low luminance areas. In an exemplary embodiment, each of the low luminance areas is in direct mechanical contact with a corresponding segment of the insulating layer, the corresponding segment of the insulating layer being in direct mechanical contact with a corresponding first contact element.

In an exemplary embodiment, the high luminance areas and low luminance areas form a two-dimensional rectangular or square array. In this embodiment, the lighting device may advantageously employed in applications using for example matrix light emitting device, LED, arrangements to replace conventional matrix LED arrangements by an inventive lighting device with suitably tailored light emission or local luminance profile.

In an exemplary embodiment, the high luminance areas correspond to pixels of a matrix light emitting diode arrangement. In this embodiment, the lighting device may correspond to a matrix LED arrangement with active pixels, inactive pixels and/or low luminance pixels, where the high luminance areas correspond to the active pixels and the low luminance areas correspond to the inactive and/or low luminance pixels. As mentioned the provision of such matrix arrangement is advantageous in particular in applications already employing matrix LED arrangements which can be easily replaced, whereby the replacement does not require modifications to a remaining system which is advantageous in terms of cost and complexity.

In an exemplary embodiment, the predefined light emission profile is an inhomogeneous light emission profile which varies (in particular spatially, e.g. across the light emission surface) in correspondence with a predefined pattern across the light emission surface. The predefined pattern may be determined in accordance with a given application to optimize a light source emission profile e.g. based on existing optics. In an exemplary embodiment, the predefined light emission profile has a maximum at or close to one edge of the light emission surface, whereby a local luminance level of the light emission surface decreases towards a minimum at or close to an opposing edge of the light emission surface. The latter light emission profile turned out to be in particular advantageous for automotive headlight applications. With the high luminance edge of the lighting device being oriented upwards (away from a ground on which a car using the lighting device is places), the lighting device emits light according to an inhomogeneous pattern which, in combination with typical headlight optics helps to prevent upward projection of light to prevent undesirable glare to oncoming road users.

It is noted that while the lighting device according to the invention may be advantageously applicable in automotive applications, further applications where an inhomogeneous emission profile is of advantage include projection systems, hand-held battery powered devices, cameras, cell phones, camera flash lights, spot lights, etc.

The features and example embodiments of the invention described above may equally pertain to the different aspects according to the present invention. In particular, with the disclosure of features relating to the lighting device according to the first aspect, also corresponding features relating to a method of producing a lighting device according to the second aspect and to the use according to the third aspect are disclosed.

It is to be understood that the presentation of embodiments of the invention in this section is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and are merely intended to conceptually illustrate the structures and procedures described herein.

BRIEF DESCRIPTION OF THE DRAWINGS

Exemplary embodiments will now be described in detail with reference to the accompanying drawings, in which.

DETAILED DESCRIPTION OF THE EMBODIMENTS

Figure 1:
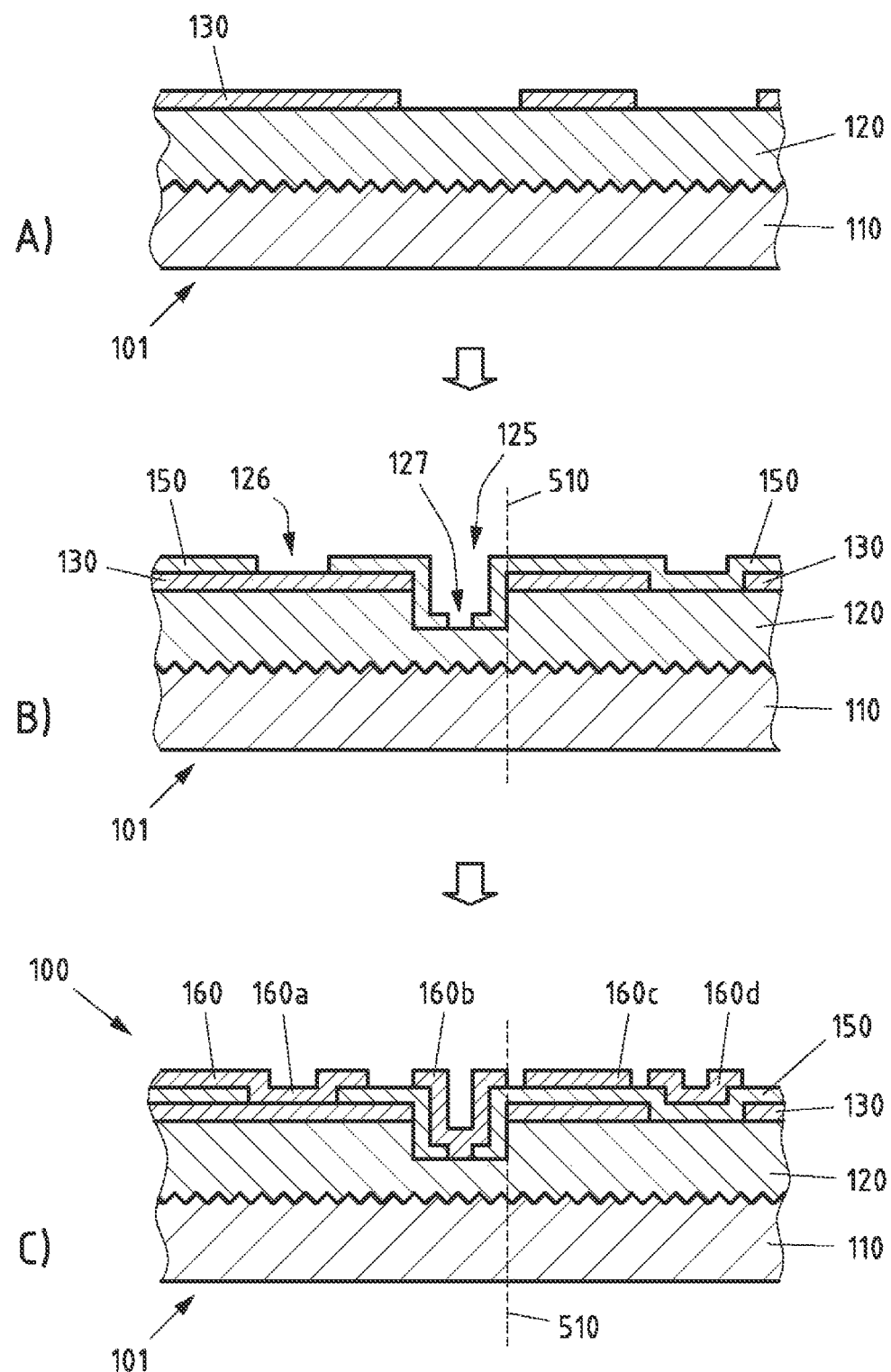
FIG. 1 shows exemplary stages of a process of producing a lighting device according to an exemplary embodiment.

FIG. 1 shows exemplary stages A to C of a process of producing a lighting device 100 according to an exemplary embodiment.

At stage A, an epitaxial layer 120 (an example of a semiconductor layer), for example comprising or consisting of GaN, is provided on a substrate 110. In further examples, epitaxial or semiconductor layer 120 may comprise or consist of InGaN and/or AlInGaP. Segments of a p-conductivity layer 130 are provided on epitaxial layer 120. While p-conductivity layer 130 is shown as a single layer, one or more layers may be formed as suitable conductivity region, e.g. depending on used materials and application. In the shown example, the substrate 110 is a patterned sapphire substrate (PSS) and the p-conductivity layer may be an aluminum layer, the corresponding segments formed in contact with a p-doped region of epitaxial layer 120. It is noted that the polarity of regions (e.g. layers) of epitaxial/semiconductor layer 120 is exemplary and can be reversed e.g. depending on material or application.

At stage B in FIG. 1, trench 125 is formed in epitaxial layer 120 e.g. using a suitable etching process and/or masking process. A depth of trench 125 is adjusted such that bottom of trench 125 reaches an n-doped region (or layer) of epitaxial layer 120. As can be taken from the figure, a corresponding trench is not formed in a portion of epitaxial layer 120 to the right of line 510, i.e. in a pixel portion of epitaxial layer 120 corresponding to a low luminance area (inactive pixel) of a light emission surface 101 of lighting device 101. It is noted that line 510 used in FIG. 1 merely illustrates the corresponding principle and does not necessarily imply a technical barrier within semiconductor layer 120 exactly at the indicated position.

Further at stage B in FIG. 1, a dielectric layer 150 (an example of an insulating layer) is provided on epitaxial layer 120, in the shown example on and in contact with conductivity layer 130. Dielectric layer 150 may for example be a 200 nm thick layer of SiN. As can be taken from the figure, dielectric layer 150 serves to provide insulation at predefined portions over epitaxial layer 120. While dielectric layer 150 is not provided in regions 126 and 127 within the pixel portion (active pixel portion) to the left of line 510 in FIG. 1B to keep conductivity layer 130 in direct contact with the p-portion of epitaxial layer 120 exposed, the corresponding electrically conductive layer 130 of the pixel portion (inactive pixel portion) to the right of line 510 in FIG. 1B is fully covered by insulating dielectric layer 150. In this way, the p-doped region of epitaxial layer 120 within the inactive pixel portion is configured not to be electrically connected (is not connectable) to a power source.

At stage C in FIG. 1, a layer 160 of electrical contact material (e.g. of gold or copper) is provided on epitaxial layer 120, in particular on portions of dielectric layer 150 and on the exposed portions of conductivity layer 130. In this way, p-contact element 160a and n-contact element 160b are formed in the active pixel region to the left of line 510, which are respectively in electrical contact with the p-doped region and the n-doped region of epitaxial layer 120. Thus, the corresponding n-doped region and p-doped region of epitaxial layer 120 are configured to be connected with an electrical power source to cause an active region between the n-doped region and the p-doped region to emit light. Conversely, contact elements 160c and 160d provided in mechanical contact with the inactive pixel region (with insulating layer 150) to the right of line 510 are not in electrical contact with epitaxial layer 120, which is thus not connectable to a power source and is configured not to emit light. It turned out that by nevertheless providing contact elements 160c and 160d on a surface of the inactive pixel region, structural integrity of the overall lighting device can be advantageously improved.

It is noted that while in the example of FIG. 1, layer 130 is provided on epitaxial layer 120 also in the inactive pixel region to the right of line 510, for example respective masks used when depositing the respective layers upon fabricating the lighting device may be adjusted such that in exemplary embodiments, no electrically conductive layers are provided within low luminance areas such as the inactive pixel region of FIG. 1. Such embodiment is advantageous in terms of material efficiency and helps to save costs.

In a further exemplary embodiment, alternatively or in addition, no insulating layer such as dielectric layer 150 is provided within low luminance areas such as the inactive pixel region of FIG. 1. While in this embodiment, contact elements 160c and 160d may be in electrical contact with the epitaxial layer 120, contact elements 160c and 160d are both in electrical contact only with a single region of epitaxial layer 120 of a same polarity (in the example of FIG. 1 a p-doped region). Thus, also in this embodiment, contact elements 160c and 160d are thus configured not to be electrically connected with at least one of the n-doped region and the p-doped region of respective low luminance areas, in this example are not configured to be connected with the n-doped region.

It is further noted that at a stage following stage C in FIG. 1 (not illustrated), substrate 110 may be removed and may e.g. be replaced by a wavelength conversion layer, e.g. a phosphor layer to convert part of light emitted from semiconductor layer 120 into a suitable different wavelength e.g. to achieve a desired light color of the lighting device. Thus, either a surface of such wavelength conversion layer, a surface of substrate 110 (a lower surface in FIG. 1) or a surface of a different layer provided on or instead of substrate 110 forms part of light emission surface 101.

As a result, the lighting device 100 shown at stage C of FIG. 1 has a light emission surface 101 comprising a high luminance area formed by a light emission surface of the semiconductor light emitting device (the active pixel) to the left of line 510 in FIG. 1 and a low luminance area formed by the electrically non-connectable portion of semiconductor layer 120 to the right of line 510 in FIG. 1.

It is noted that in an alternative embodiment (not illustrated), a low luminance area may be achieved by providing the portion to the right of line 510 similar to the portion to the left of line 510, whereby in this embodiment, contact elements connected to the portion to the left of line 510 are connected in series with contact elements of similar portions (not shown in the simplified figure), while contact elements connected to the portion to the right of line 510 are connected in parallel with contact elements of similar portions (not shown in the simplified figure). In this way, corresponding low luminance areas may only emit light at a lower luminance (e.g. lower by a factor of 3 to 10) as compared to the active pixels that are connected in series to the power source. Such pixels of reduced luminance may be provided in addition or alternatively to inactive pixels in a light emitting device. For example, such pixels of reduced local luminance may be provided in between active pixels and inactive pixels to achieve a smooth local luminance transition at the light emission surface 101. Accordingly, a corresponding intensity distribution within a Fourier plane of corresponding optics may be improved.

Figure 2:
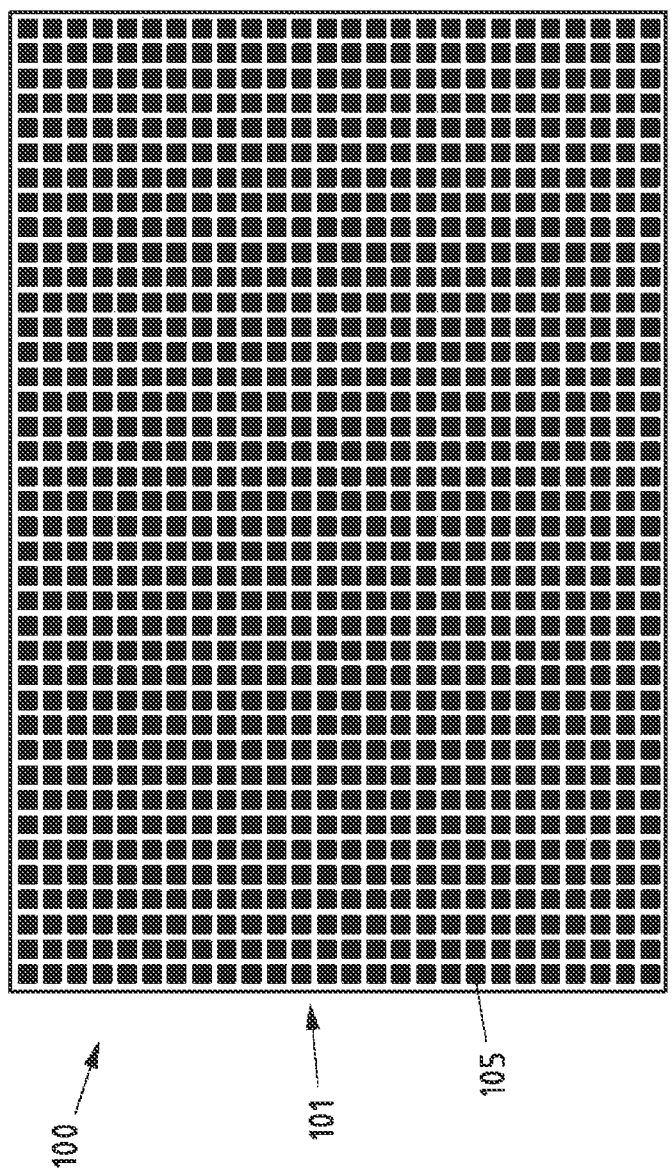
FIG. 2 shows a plan view of a light emission surface of a lighting device according to an exemplary embodiment.

FIG. 2 shows a plan view of light emission surface 101 of lighting device 100. As can be taken from this figure, pixels 105 form a matrix arrangement where each pixel corresponds to a high luminance area 106b (such pixel e.g. corresponding to a semiconductor light emitting device of semiconductor light emitting devices connected in series to a power source) or to a low luminance area 106a (such pixel e.g. corresponding to a semiconductor light emitting device of semiconductor light emitting devices connected in parallel to a power source, or to a portion of a semiconductor not or only partially connectable to a power source).

Figure 3:
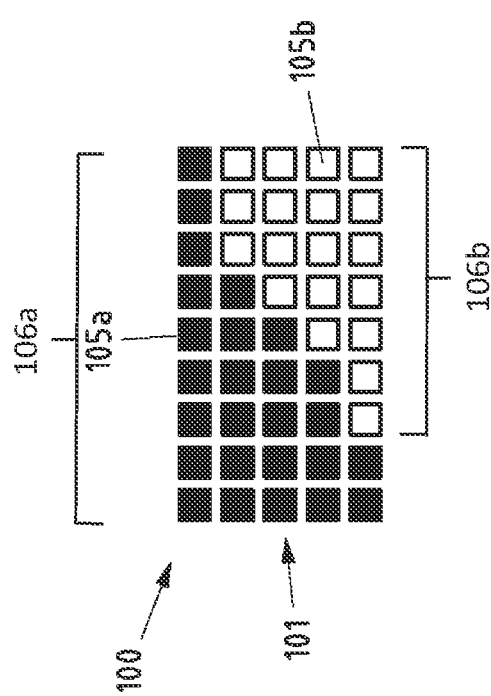
FIG. 3 shows part of a plan view of a light emission surface of a lighting device according to an exemplary embodiment.

As conceptually illustrated in FIG. 3, which shows part of a plan view of a light emission surface 101 of a lighting device 100, it thus becomes possible to tailor desired light emission profiles of a light emission surface 101 by arranging high luminance areas 105b of the high luminance area 106a and low luminance areas 105a of the low luminance area 106a in accordance with a predefined pattern across the light emission surface 101.

Figure 4:
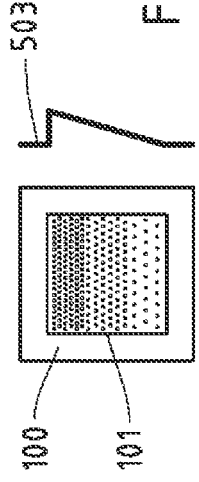
FIG. 4 shows an example of a light emission surface of a lighting device according to an exemplary embodiment.

FIG. 4 shows an example of a light emission surface 101 of a lighting device 100, where such predefined light emission profile has a maximum at or close to an upper edge of the light emission surface 101. As illustrated by the density of dots in the figure and the accompanying emission intensity (or local luminance) profile 503, a local luminance level of the light emission surface 101 decreases towards a minimum at or close to a lower edge of the light emission surface 101. Such intensity profile is in particular advantageous for applications in the automotive field, in particular for automotive headlights as in combination with typical headlight optics, it helps to avoid undesirably upwardly projecting light beams.

Figure 5:
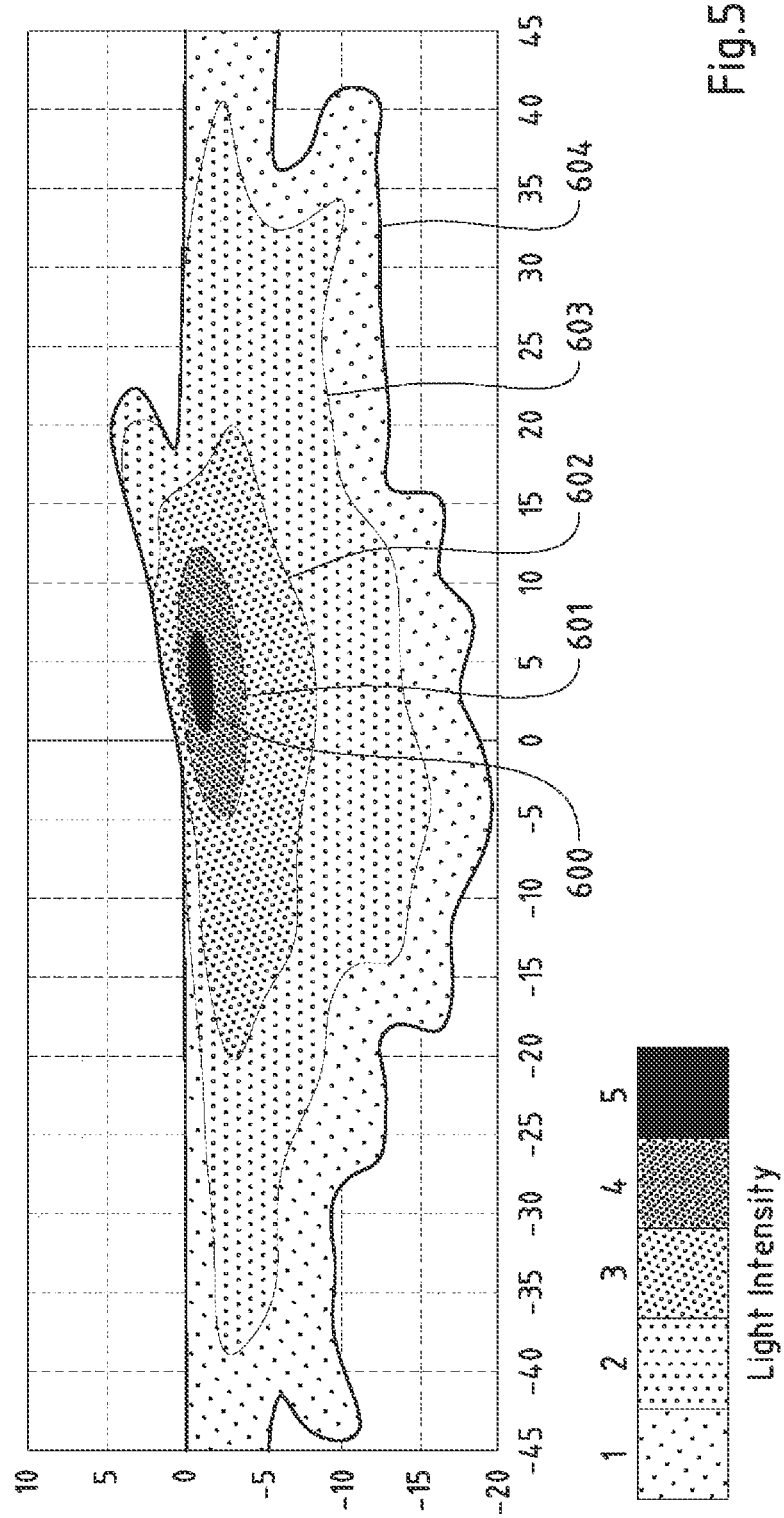
FIG. 5 shows an intensity distribution within a Fourier plane resulting from a light emission profile of a lighting device according to an exemplary embodiment.

FIG. 5 illustrates an intensity distribution within a Fourier plane resulting from a light emission profile 503 of the lighting device 100 according to an exemplary embodiment. Hereby, a density of dots in the figure conceptually illustrates the corresponding magnitude of light intensity as also shown in the corresponding scale in arbitrary units. Contour lines 600 to 604 respectively indicate corresponding levels of light intensity within the Fourier plane. As can be taken from FIG. 5, a lighting device 100 with a light emission surface 101 with this light emission profile enables an intensity distribution within the Fourier plane (of optics typically used for automotive headlights) which is more concentrated towards an upper edge while avoiding disturbing upwardly projecting beams and disturbing sidewards projecting beams.

LIST OF REFERENCE SIGNS

100 Lighting device
101 Light emission surface
105 High/low luminance area (Pixel)
105a Low luminance areas
105b High luminance areas
106a Low luminance area
106b High luminance area
110 Substrate
120 Semiconductor/epitaxial layer
125 Trench
126 Exposed region
127 Exposed region
130 Conductivity layer
150 Dielectric layer
160 Contact layer
160a p-contact element
160b n-contact element
160c Contact element
160d Contact element
503 Emission intensity profile
510 Line
600-604 Light intensity within the Fourier plane

What is claimed is:

1. A lighting device comprising:
at least one semiconductor layer;
at least one light emission surface comprising an array of high luminance areas forming a high luminance area configured to emit light at a first local luminance level and low luminance areas forming a low luminance area configured to emit no light;
a plurality of semiconductor light emitting devices formed in the semiconductor layer to define the high luminance area;
wherein the high luminance area and the low luminance area are arranged in accordance with a predefined light emission profile of the light emission surface;
wherein the low luminance areas of the low luminance area correspond to a portion of the semiconductor layer comprising an n-doped region and a p-doped region, wherein at least one of the n-doped region and the p-doped region is configured not to be electrically connected to a power source,
and wherein the high luminance areas of the high luminance area are configured to be electrically connected in series to the power source.

2. The lighting device of claim 1, further comprising a plurality of trenches formed in the at least one semiconductor layer defining the high luminance areas and the low luminance areas.

3. The lighting device of claim 1, further comprising first contact elements respectively arranged in correspondence with the low luminance areas and second contact respectively arranged in correspondence with the high luminance areas.

4. The lighting device of claim 3, wherein the first contact elements are configured not to be electrically connected with at least one of the n-doped region and the p-doped region of respective low luminance areas.

5. The lighting device of claim 3, wherein segments of an insulating layer are respectively interspaced in between the first contact elements and corresponding low luminance areas.

6. The lighting device of claim 1, wherein the high luminance areas and low luminance areas form a two-dimensional rectangular or square array.

7. The lighting device of claim 1, wherein the high luminance areas correspond to pixels of a matrix light emitting diode arrangement.

8. The lighting device of claim 1, wherein the predefined light emission profile is an inhomogeneous light emission profile which varies in correspondence with a predefined pattern across the light emission surface.

9. The lighting device of claim 1, wherein the predefined light emission profile has a maximum at or close to one edge of the light emission surface, whereby a local luminance level of the light emission surface decreases towards a minimum at or close to an opposing edge of the light emission surface.

10. A method of producing the lighting device of claim 1, the method comprising:
providing the at least one semiconductor layer;
providing the at least one light emission surface with the array of high luminance areas forming the high luminance area configured to emit light at a first local luminance level and the low luminance areas forming the low luminance area configured to emit no light;
forming the plurality of semiconductor light emitting devices in the semiconductor layer to define the high luminance area;
arranging the high luminance area and the low luminance area in accordance with the predefined light emission profile of the light emission surface;
wherein the low luminance areas of the low luminance area correspond to the portion of the semiconductor layer comprising the n-doped region and the p-doped region, wherein the at least one of the n-doped region and the p-doped region is configured not to be electrically connected to the power source,
and wherein the high luminance areas of the high luminance area are configured to be electrically connected in series to the power source.

11. The method of claim 10, further comprising:
arranging first contact elements respectively in correspondence with the low luminance areas and second contact elements respectively in correspondence with the high luminance areas.

12. The method of claim 11, further comprising:
arranging the first contact elements respectively to be not in electrical contact with at least one of the n-doped region and the p-doped region of respective low luminance areas.

13. An automotive headlight device comprising the lighting device of claim 1.

* * * * *